United States Patent [19]

Torode

[11] Patent Number: 5,451,912

[45] Date of Patent: Sep. 19, 1995

[54] METHODS AND APPARATUS FOR A PROGRAMMABLE FREQUENCY GENERATOR THAT REQUIRES NO DEDICATED PROGRAMMING PINS

[75] Inventor: John Torode, Hunts Point, Wash.

[73] Assignee: Cypress Semiconductor Corp., San Jose, Calif.

[21] Appl. No.: 259,323

[22] Filed: Jun. 13, 1994

[51] Int. Cl.⁶ .................................................. H03L 7/00
[52] U.S. Cl. .................................. 331/108 C; 331/18; 331/177 R
[58] Field of Search ................ 331/1 A, 18, 34, 108 C, 331/108 D, 172, 173; 326/37, 38, 47; 365/189.03, 189.04

[56] References Cited

U.S. PATENT DOCUMENTS

| | | | |
|---|---|---|---|
| 4,689,581 | 8/1987 | Talbot | 331/1 A |
| 5,349,544 | 9/1994 | Wright et al. | 364/600 |

FOREIGN PATENT DOCUMENTS 291161 11/1990 Japan.
297223 12/1991 Japan.

OTHER PUBLICATIONS

T. G. Giles, "A Universal Frequency Synthesizer IC", Aug. 1979, Philips Telecommunication Review, vol. 37, No. 3, pp. 177–181.

Cypress Semiconductor Marketing Brochure, Published Nov., 1993, pp. 5–7, a publication of Cypress Semiconductor, San Jose, Calif.

*Primary Examiner*—Robert J. Pascal
*Assistant Examiner*—David H. Vu
*Attorney, Agent, or Firm*—Blakely, Sokoloff, Taylor & Zafman

[57] ABSTRACT

A programmable crystal oscillator that generates a wide range of possible frequencies with high stability is disclosed. The programmable crystal clock oscillator includes an industry standard oscillator package, a programmable storage, a crystal and a phase lock loop (PLL) circuit coupled to the crystal and the programmable storage. The industry standard package does not contain any dedicated programming connections. A programmable storage, contained within the package, stores parameters representing a desired output frequency for the crystal oscillator. The crystal is enclosed within the package and provides a source frequency. The PLL circuit, also enclosed in the package, receives the source frequency, and produces the desired output frequency, within the wide range of possible frequencies, based on the parameters.

20 Claims, 9 Drawing Sheets

| DCA1-0 | PH2-0 | 3V ENABLE | XMUX2-0 | TRIM | Q6-Q0 | CONFIG2-0 | P6-P0 | SECF | BURN | START |

*Figure 9*

METHODS AND APPARATUS FOR A PROGRAMMABLE FREQUENCY GENERATOR THAT REQUIRES NO DEDICATED PROGRAMMING PINS

FIELD OF THE INVENTION

The present invention relates to frequency synthesis devices, and more particularly, to a programmable crystal oscillator for generating a desired frequency.

BACKGROUND OF THE INVENTION

Many forms of oscillators are used in electronic devices, such as personal computers, electronic instrumentation, telecommunications equipment, etc., to provide stable timing signals necessary for proper operation of the devices. In many forms, the oscillators are driven by crystals (e.g. quartz). In crystal oscillators, the crystals are trimmed such that the size and shape of the crystal determines the preferred frequency. The trimming process involves carefully cutting and polishing the crystal to vibrate at a desired frequency when operating in conjunction with an oscillator circuit. However, due to inevitable tolerances in the trimming process, crystals trimmed to operate at the same frequency do not all operate at exactly the preferred frequency. Instead, the crystals operate in a band of frequencies including the preferred frequency. Consequently, oscillators are specified with a tolerance that accounts for the statistical variation in the operational frequencies of the individual oscillators.

The preferred operating frequencies of oscillators implemented in electronic devices vary depending upon the particular application of the electronic devices. Because each application for an oscillator may require a different frequency, a distributor of crystal oscillators typically maintains a complete stock of non-programmable oscillators. The stock of oscillators are typically set for common frequencies used by electronic devices, such as computers. However, if a customer requires a custom frequency, a manufacturer of crystals must laboriously cut or plate by hand tiny electromechanical parts to obtain the required crystal characteristics for operation at the custom frequency. Furthermore, in order to provide the custom frequency, the manufacturer of the crystal oscillator may require 10 to 12 weeks to generate the custom crystal. Typically, for faster turnaround, shorter time frames incur premium charges on a sliding scale.

SUMMARY AND OBJECTS OF THE INVENTION

Therefore, it is an object of the present invention to provide an oscillator that is programmable to generate a wide range of output frequencies with high stability.

It is a further object of the present invention to provide a crystal oscillator implemented with a single crystal that is programmable to generate a wide range of output frequencies with high stability It is another object of the present invention to provide a programmable crystal oscillator that does not require any more printed circuit board space than a conventional crystal oscillator.

It is another object of the present invention to provide a programmable crystal oscillator that does not require any dedicated programming connections.

These and other objects are realized in a programmable crystal oscillator that generates a wide range of possible frequencies with high stability. The programmable crystal clock oscillator includes an industry standard oscillator package, a programmable storage, a crystal and a phase lock loop circuit coupled to the crystal and the programmable storage. The industry standard package does not contain any dedicated programming connections. A programmable storage, contained within the package, stores a parameter representing a desired output frequency for the crystal oscillator. The crystal is enclosed within the package and provides a source frequency. The PLL circuit, also enclosed in the package, receives the source frequency, and produces the desired output frequency, within the wide range of possible frequencies, based on the parameter.

Other objects, features and advantages of the present invention will be apparent from the accompanying drawings, and from the detailed description that follows below.

BRIEF DESCRIPTION OF THE DRAWINGS

The objects, features, and advantages of the present invention will be apparent from the following detailed description of the preferred embodiment of the invention with references to the following drawings.

FIG. 9 illustrates an input parameter for selecting a desired output frequency configured in accordance with one embodiment of the present invention.

DETAILED DESCRIPTION

Methods and apparatus for a programmable crystal oscillator are disclosed. In the following description, for purposes of explanation, specific nomenclature is set forth to provide a thorough understanding of the present invention. However, it will be apparent to one skilled in the art that these specific details are not required to practice the present invention. In other instances, well known circuits and devices are shown in block diagram form to avoid obscuring the present invention unnecessarily.

Figure 1:
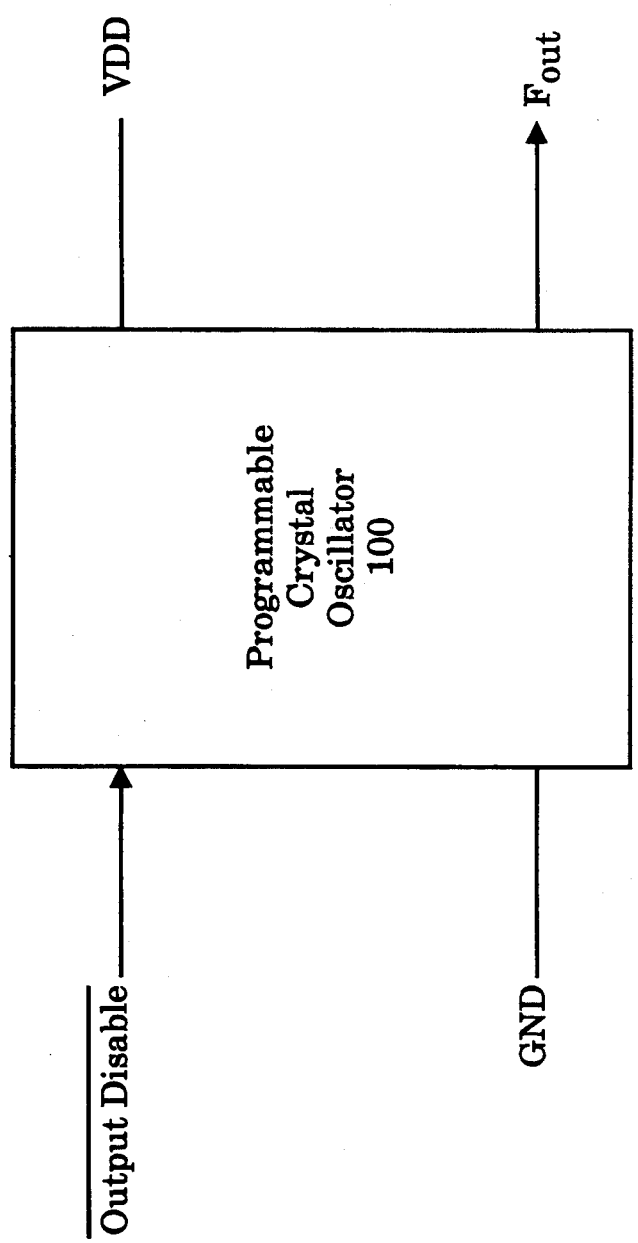
FIG. 1 illustrates one embodiment for an enclosure of a programmable crystal oscillator of the present invention.

FIG. 1 illustrates one embodiment for an enclosure of a programmable crystal oscillator of the present invention. In one embodiment, a programmable crystal oscillator 100 is housed within a package having a plurality of connections and no dedicated programming connections. For this embodiment, the programmable crystal oscillator 100 contains four input/output (I/O) connections. The programmable crystal oscillator 100 receives, as inputs, an output disable ($\overline{OD}$), a supply voltage ($V_{dd}$), and ground (GND). In turn, the programmable crystal oscillator 100 generates an output frequency ($F_{OUT}$), based on a programmed parameter as will be described more fully below.

In one embodiment, the package comprises an industry standard four pin canned package for crystal oscillators. The industry standard package for the programmable crystal oscillator 100 provides dimensions, pinout and electrical characteristics that are identical to a conventional can oscillator. Because the programmable crystal oscillator 100 is enclosed within the industry standard package, no additional connections or pins are required for programming. The programmable crystal oscillator 100 packaging includes a grounded metal cover to provide a hermetically sealed package and to reduce electromagnetic interference (EMI). For the industry standard canned package, the output disable input is received on pin 1, the ground connection is received on pin 7, the $V_{dd}$ power is received on pin 14, and $F_{OUT}$ is generated on pin 8.

The output disable ($\overline{OD}$) pin is a three-state disable for the $F_{OUT}$ signal, wherein a low logic signal results in the output frequency ($F_{OUT}$) being disabled in the high impedance state. If the $\overline{OD}$ pin is set to a high logic level or left floating, then the output frequency ($F_{OUT}$) is enabled. The voltage supply $V_{dd}$ is specified at 5 volts or 3.3 volts. The programmable crystal oscillator 100 utilizes complementary metal oxide semiconductor (CMOS) technology, and is capable of driving CMOS and TTL levels. As will become apparent from the description below, the programmable crystal oscillator 100 requires no external components.

Figure 2:
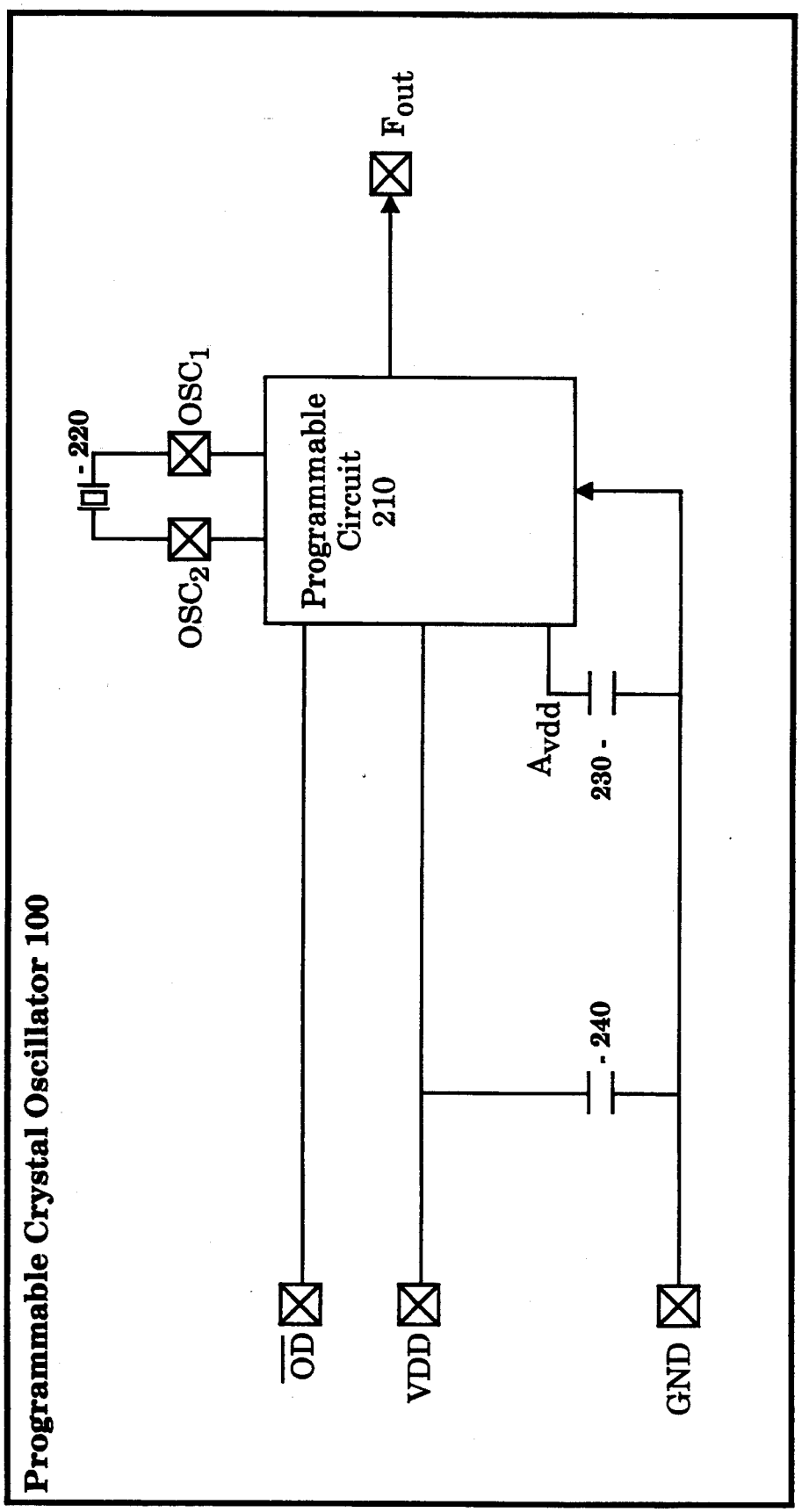
FIG. 2 illustrates one embodiment of the programmable crystal oscillator of the present invention.

FIG. 2 illustrates one embodiment of the programmable crystal oscillator 100 of the present invention. The programmable crystal oscillator 100 contains a programmable circuit 210 and a crystal 220. The programmable circuit 210 permits one time selectability of a wide range of frequencies, ranging from 600 kilo hertz (KHz) to 120 mega hertz (MHz), with use of the single crystal 220. In one embodiment, the resonant frequency of crystal 220 is nominally 14.31818 MHz or 18.432 MHz, and the programmable circuit 210 is implemented on a single integrated circuit die. FIG. 2 also shows integrated circuit die pads for coupling the programmable circuit 210 to the crystal 220 and external I/O connections.

In addition to the programmable circuit 210 and crystal 220, the programmable crystal oscillator 100 also includes capacitors 240 and 230. The programmable circuit 210 requires two different supply voltages. The input power supply voltage, $V_{dd}$, is utilized to supply the digital circuitry in the programmable circuit 210. In addition, an analog supply voltage, designated as $AV_{dd}$ on FIG. 2, is generated from the supply voltage $V_{dd}$. Specifically, the $AV_{dd}$ supply voltage is generated via a voltage regulator implemented with a resistive-capacitive (RC) power filter. In one embodiment, the RC power filter contains a resistor (not shown) and capacitors 230 and 240. The resistor may be fabricated directly on the programmable circuit 210 die. The capacitor 240 comprises a 2.2 microfarad electrolytic capacitor, and the capacitor 230 comprises a 0.1 microfarad monolithic ceramic capacitor. The filtered power signal, $AV_{dd}$, is utilized in a voltage controlled oscillator circuit as will be described more fully below.

Figure 3:
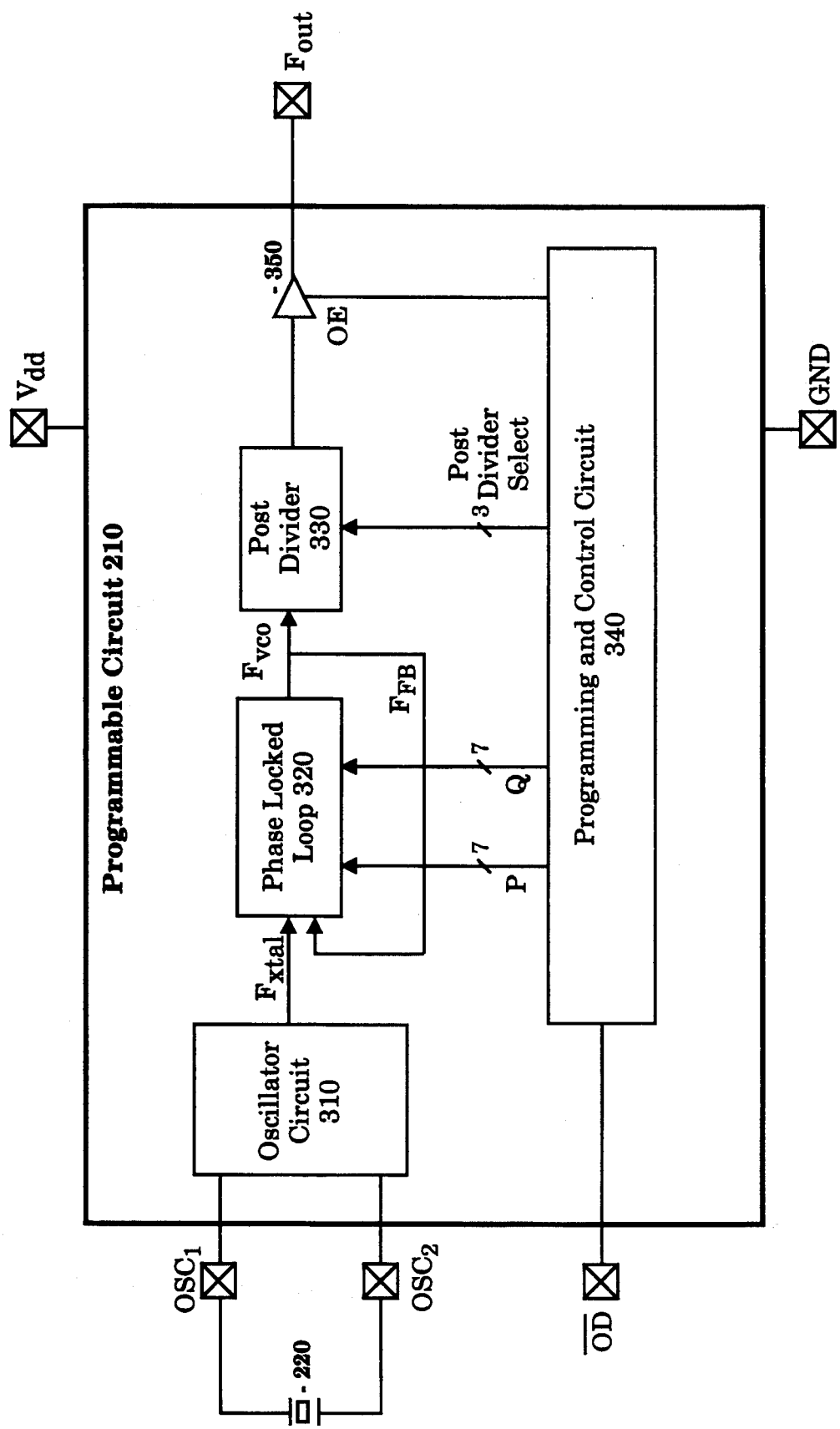
FIG. 3 illustrates one embodiment for the frequency synthesis circuit configured in accordance with the present invention.

FIG. 3 illustrates one embodiment for the frequency synthesis circuit configured in accordance with the present invention. The frequency synthesis circuit contains the crystal 220 and the programmable circuit 210. The programming circuit 210 includes an oscillator circuit 310 coupled to a phase lock loop (PLL) circuit 320. The oscillator circuit 310 generates the crystal frequency ($F_{xtal}$) signal for input to the phase lock loop 320. Alternatively, a reference frequency ($F_{ref}$) may be input externally to a pad on the programmable circuit 210 die. The programmable circuit 310 also includes a post divider circuit 330, a programming and control circuit 340, and an output buffer 350. The programming and control circuit 340 is coupled to the output disable ($\overline{OD}$) input so as to receive serial input data. In general, the serial input data contains parameters to specify the output frequency, $F_{out}$. In order to control the $F_{out}$ frequency, the programming and control circuit 340 is coupled to the phase lock loop 320, post divider 330 and output buffer 350.

The phase lock loop 320 contains, in part, a "P" programmable divider and a "Q" programmable divider. In order to control the operation of the phase lock loop 320, the programming and control circuit 340 provides "P" and "Q" data. The phase lock loop 320 receives the source frequency, $F_{xtal}$, and generates a voltage controlled oscillator frequency, $F_{vco}$, based on the "P" and "Q" data. The programming and control circuit 340 provides post divider select parameters. The $F_{vco}$ frequency is input to the post divider 330, and the post divider 330 divides the $F_{vco}$ frequency based on the post divider select parameter. A feedback frequency, $F_{FB}$, is generated from either the post divider 330 or phase lock loop 320 depending upon a particular field specified in the input parameter. Consequently, a range of frequencies for the $F_{OUT}$ signal is generated based on the programmable parameters.

The output frequency from the post divider 330 is input to the output buffer 350. The output buffer 350 provides the appropriate current buffering to drive the $F_{OUT}$ signal external to the programming circuit 310. In addition, the output buffer 350 receives an output enable (OE) signal from the programming and control circuit 340. The output buffer 350 provides the three state operation for the $F_{out}$ frequency signal.

Figure 4:
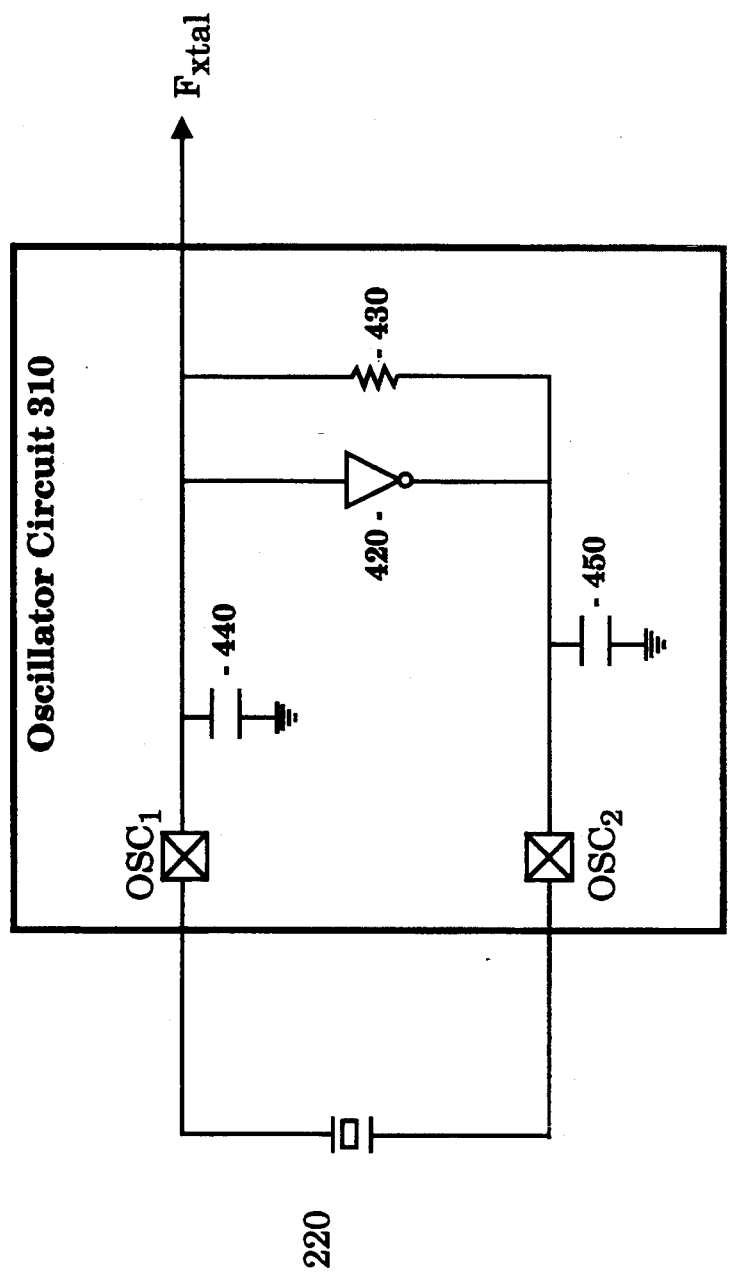
FIG. 4 illustrates one embodiment for an oscillator circuit configured in accordance with the present invention.

FIG. 4 illustrates one embodiment for an oscillator circuit configured in accordance with the present invention. In one embodiment, the oscillator circuit 310 contains an inverter 420, resistor 430 and capacitors 440 and 450. The oscillator circuit 310 is coupled to the crystal 320 as shown in FIG. 4. Specifically, each end of the crystal 220 is coupled to pads located on the integrated circuit die for the programming circuit 210. The oscillator circuit 310 contains those components typically found in a crystal oscillator circuit as such, which are well known in the art and will not be described further.

Figure 5:
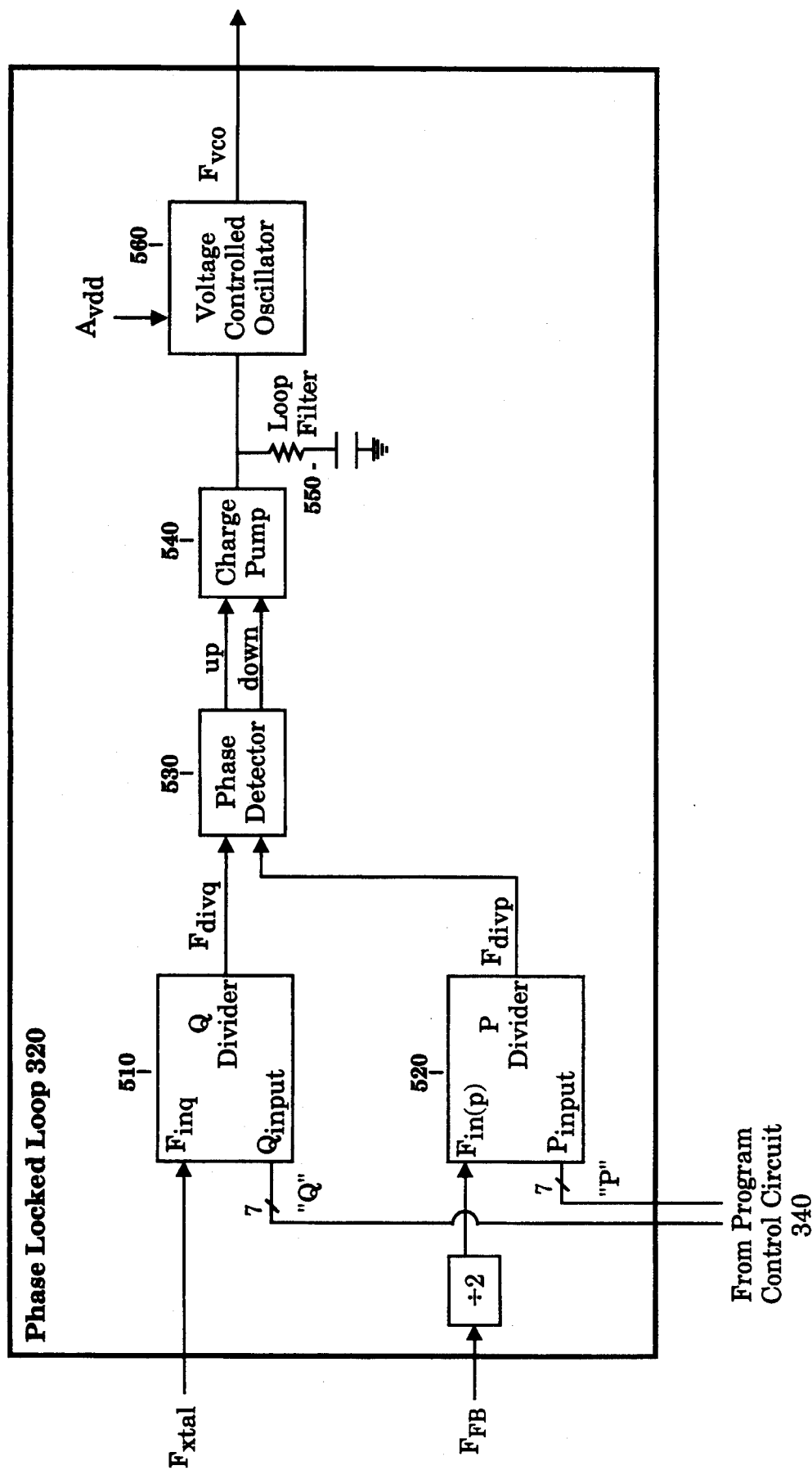
FIG. 5 illustrates a phase lock loop circuit configured in accordance with one embodiment of the present invention.

FIG. 5 illustrates the phase lock loop circuit configured in accordance with one embodiment of the present invention. As discussed above, the phase lock loop circuit 320 receives, as inputs, $F_{xtal}$ and $F_{FB}$ and generates the $F_{vco}$ frequency. The phase lock loop 320 contains two programmable dividers: "Q" programmable divider 510 and "P" programmable divider 520. The "Q" programmable divider 510, receives as inputs, the "Q" parameter from the programming and control circuit 340 and the $F_{xtal}$ frequency, and generates, as an output, a $F_{divq}$ frequency. The $F_{divq}$ frequency is equal to the $F_{xtal}$ frequency divided by the "Q" parameter. The "P" programmable divider 520 receives as inputs, the "P" parameter from the programming and control circuit 340 and the $F_{FB}/2$ frequency, and generates, as an output, a $F_{divp}$ frequency. The $F_{divp}$ is equal to the feedback frequency, $F_{FB}$, divided by two times the "P" parameter. The "Q" and "P" programmable dividers, 510 and 520 respectively, are intended to represent a broad category of programmable counters utilized as frequency dividers which are well known in the art and will not be described further.

The $F_{divq}$ and $F_{divp}$ signals are input to a phase detector 530. The phase detector 530 generates an input for a charge pump circuit 540 in accordance with the phase differential between the $F_{divq}$ signal and the $F_{divp}$ signal. A charge pump current is input to a loop filter 550. The loop filter 550 is a low pass filter that defines the response of the phase lock loop. In one embodiment, the loop filter 550 is implemented with a series resistor and capacitor coupled to ground.

The filtered voltage output from the loop filter 550 is input to a voltage controlled oscillator 560. The voltage controlled oscillator 560 generates a frequency based on the amplitude of the voltage input from the loop filter 550. The output of the voltage controlled oscillator 560 is the $F_{vco}$ signal. The phase detector 530, charge pump circuit 540, loop filter 550 and voltage controlled oscillator 560 are intended to represent a broad category of phase lock loop and voltage controlled oscillator circuits utilized to phase lock two input signals, which are well known in the art and will not be described further.

The selection of "P" and "Q" parameters define a first stage for programming a desired output frequency. The frequency of the $F_{vco}$ signal is defined by the relationship:

$$F_{vco} = \frac{F_{xtal} \cdot 2 \cdot P}{Q}$$

In order to ensure stable operation of the $F_{vco}$ signal, "P" is selected as an integer value between 4 and 130 and "Q" is selected as an integer value between 3 and 129. Consequently, proper selection of the "P" and "Q" parameters permits generation of a number of output frequencies.

Figure 6:
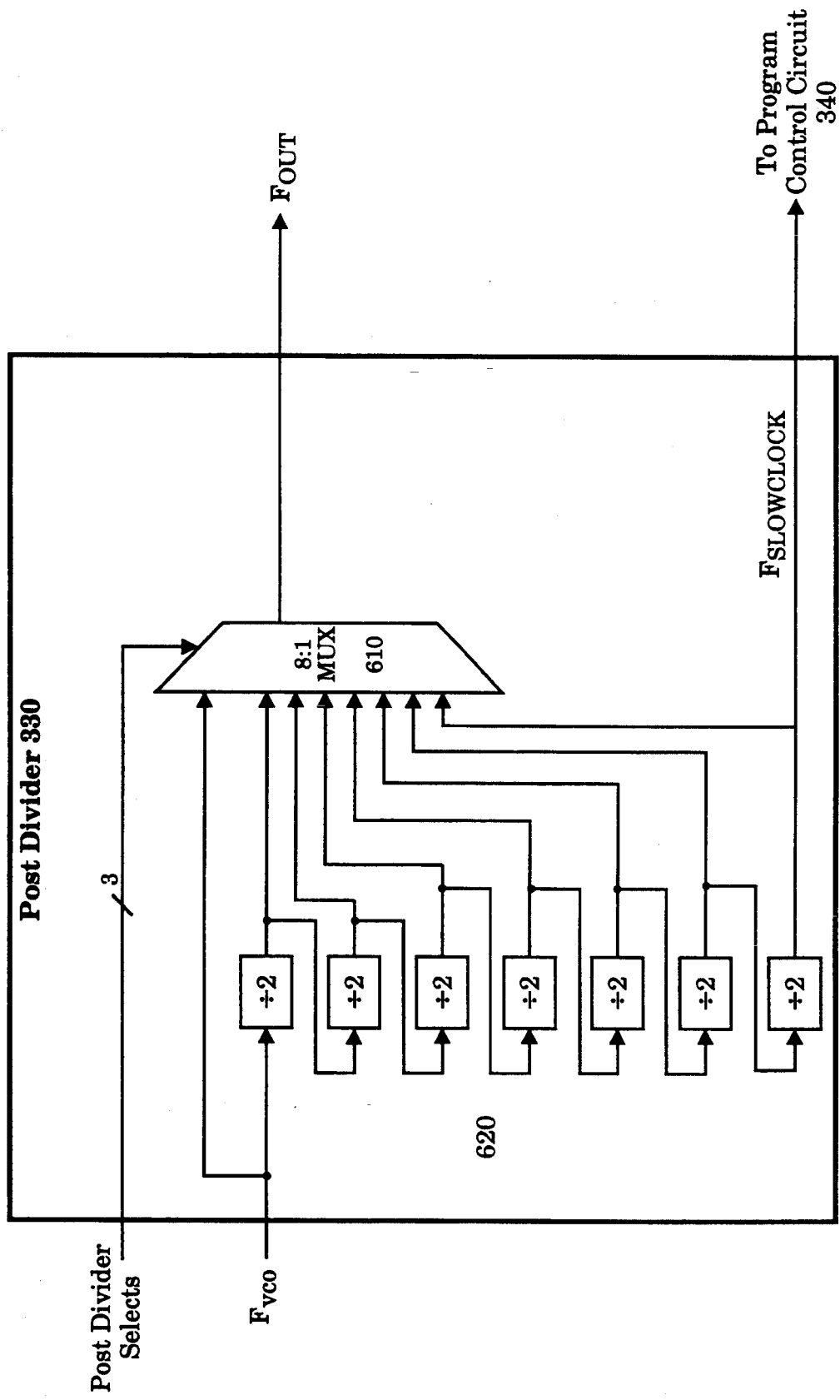
FIG. 6 illustrates a post divider circuit configured in accordance with one embodiment of the present invention.

FIG. 6 illustrates a post divider circuit configured in accordance with one embodiment of the present invention. In general, the post divider circuit 330 defines a second stage for defining the output frequency of the oscillator, allowing output frequencies lower than the minimum frequency of the VCO. The post divider circuit 330 receives, as inputs, the post divider selects and the $F_{vco}$ frequency, and generates, as outputs, the signals $F_{out}$ and $F_{slowclock}$. In one embodiment, the post divider 330 contains an 8 to 1 (8:1) multiplexer (MUX) 610 and a plurality of divide by two frequency divider circuits 620. The post divider 330 circuits performs a programmable divide by $2^n$ function, wherein n is defined by the post divide selects. For this embodiment, the $F_{vco}$ signal is input to a first divide by two circuit, and is also provided as an input to the MUX 610. The output of each divide by two circuit is input to a subsequent divide by two circuit in the $2^n$ chain and to MUX 610 so as to provide eight inputs to the MUX 610.

In operation, the programming and control circuit 340 generates the post divider select signals to the MUX 610 to select the desired frequency as the $F_{out}$ signal.

The $F_{out}$ signal is input to the output buffer circuit 350 to generate, when enabled, the output frequency of the programmable crystal oscillator 100. The $F_{vco}$ divided by 128 signal is designated as the $F_{slowclock}$, and is input to the programming and control circuit 340.

Figure 7:
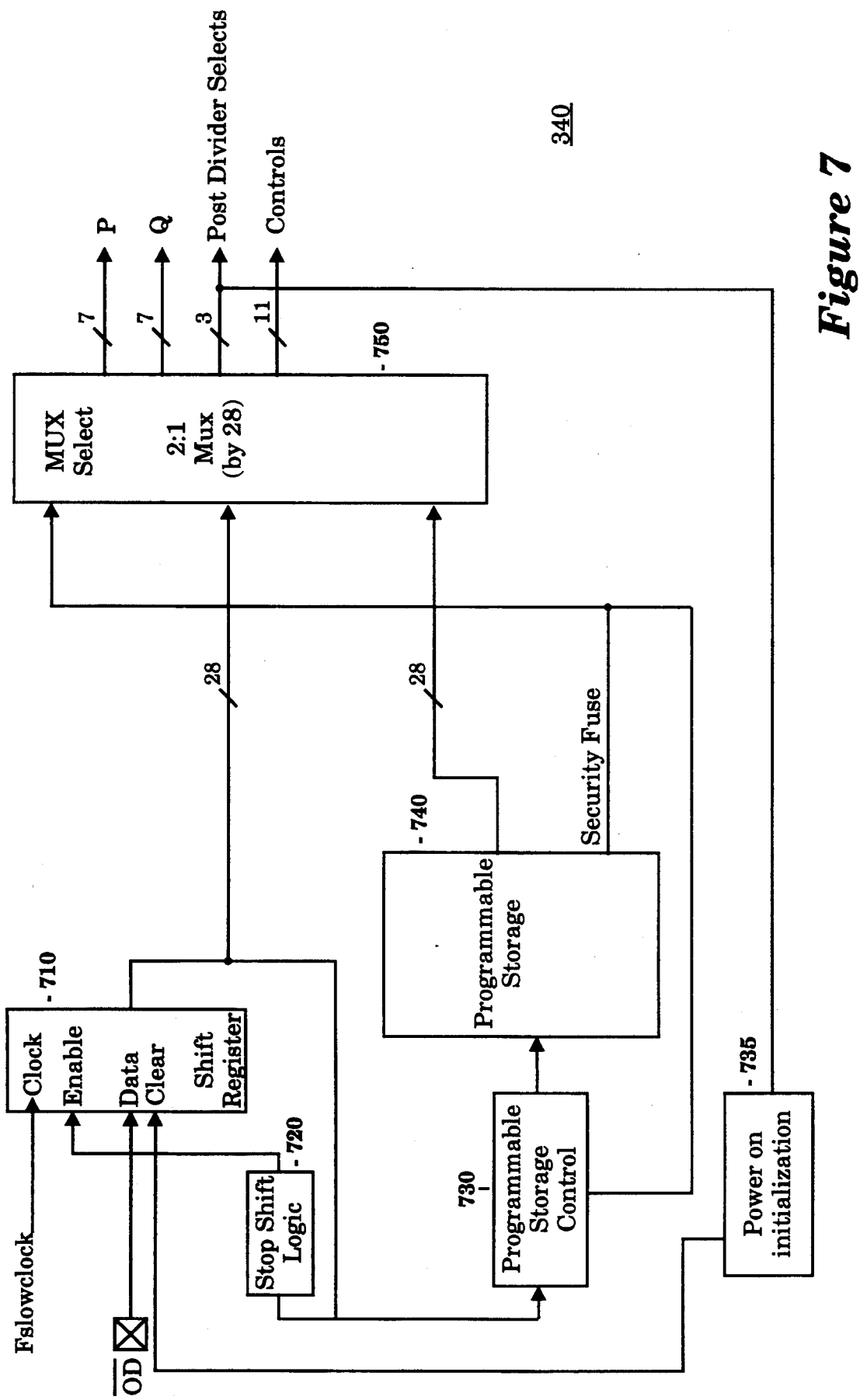
FIG. 7 illustrates one embodiment for the programming and control circuit configured in accordance with the present invention.

FIG. 7 illustrates one embodiment for the programming and control circuit configured in accordance with the present invention. In general, the programming and control circuit 340 permits selection of the "P" parameter, "Q" parameter, post divider selects, and other control information. The programming data are generated from either being directly input through the output disable ($\overline{OD}$) connection or from a programmable storage device within the invention. In one embodiment, the programming and control circuit 340 contains a shift register 710, programmable storage 740, programmable storage control 730, and a multiplexer (MUX) 750.

The shift register 710 is utilized as a receiver for data being input to the programmable crystal oscillator 100. The shift register 710 contains, in part, a clock input, data input, clear and output enable. In general, the shift register 710 converts serial input data to parallel data when appropriate. The shift register 710 is coupled to receive, at the clock input, the $F_{slowclock}$ frequency from the post divide circuit 330. The data input is coupled to the output disable ($\overline{OD}$) pad so as to receive serial data from an external source. The shift register 710 continually shifts data when the programmable crystal oscillator 100 is powered on. However, upon detection of a start bit, which signifies the beginning of input parameter data, the shift register 710 shifts in the serial data parameter, and subsequently converts the serial data parameter into 28 bits of parallel data.

In order to control the input of data into the shift register 710, the programming and control circuit 340 contains stop shift logic 720. The stop shift logic 720 is coupled to the shift register 710. In general, the stop shift logic 720 analyzes a bit, designated as the start bit, within the input parameter, and enables the shift register 710 to continue shifting input bits for the entire length of the data parameter. Specifically, the start bit is designated as a logic "1". The stop shift logic 720 disables, by deactivating the output enable, the shift register 710 from receiving data after the entire input parameter are received by detecting the start bit, "1", at the end of the input parameter. In one embodiment, the data parameter includes 28 bits of program and control data.

The programming and control circuit 340 also contains the programmable storage 740 and the programmable storage control 730. In one embodiment of the present invention, the programming storage 740 comprises electrically programmable fuses. For this embodiment, the programming storage control is configured to blow the fuses when a burn bit in the input parameter is set. Although the programmable storage may comprise electrically programmable fuses, the programmable storage 740 may comprise electrically programmable read only memory (EPROM) or electrically erasable programmable read only memory (EEPROM). When utilizing a ROM device for the programmable storage 740, the programmable storage control 730 is replaced with the appropriate control circuitry to program the ROM device. The programmable storage control 730 and the programmable storage 740 are intended to represent a broad category of programmable devices and means for programming the programmable devices, respectively which are well known in the art.

In operation, the input parameter contains a security fuse bit (SECF) and a program or burn bit. The burn and SECF bits are input to the programmable storage control 730 to determine whether to permanently program the programmable storage control 730. If the input data are a test vector, as indicated by the burn bit, then the programmable storage control 730 does not program the data into the programmable storage 730. In one embodiment, the programmable storage control 730 includes two parallel NAND gates. When the SECF and burn bits are appropriately set, the programmable storage control 730 programs the programmable storage 740 in accordance with the input data.

The programming storage 740 contains a security fuse. The security fuse output is coupled to the select of the MUX 750, and is utilized to select the data from the programming storage 740, when the security fuse is blown, as the output of the programming and control circuit 340. Alternatively, when the security fuse is not blown, the output data from the shift register 710 are selected as the output of the programming and control circuit 340. Once the security fuse is blown, the programmable storage 740 is always selected as the output of the programming and control circuit 340.

The programming and control circuit 340 also contains a power-on initialization circuit 735. In general, when power is first applied to the programming circuit 310, the power on initialization circuit 735 supplies a reset signal so as to clear the shift register 710 (e.g. all registers of the shift register are set to zero). In addition, the power-on initialization circuit 735 initially sets post divide circuit 330. For proper operation during programming, the power is cycled each time the programming circuit 310 receives a new input parameter.

Figure 8:
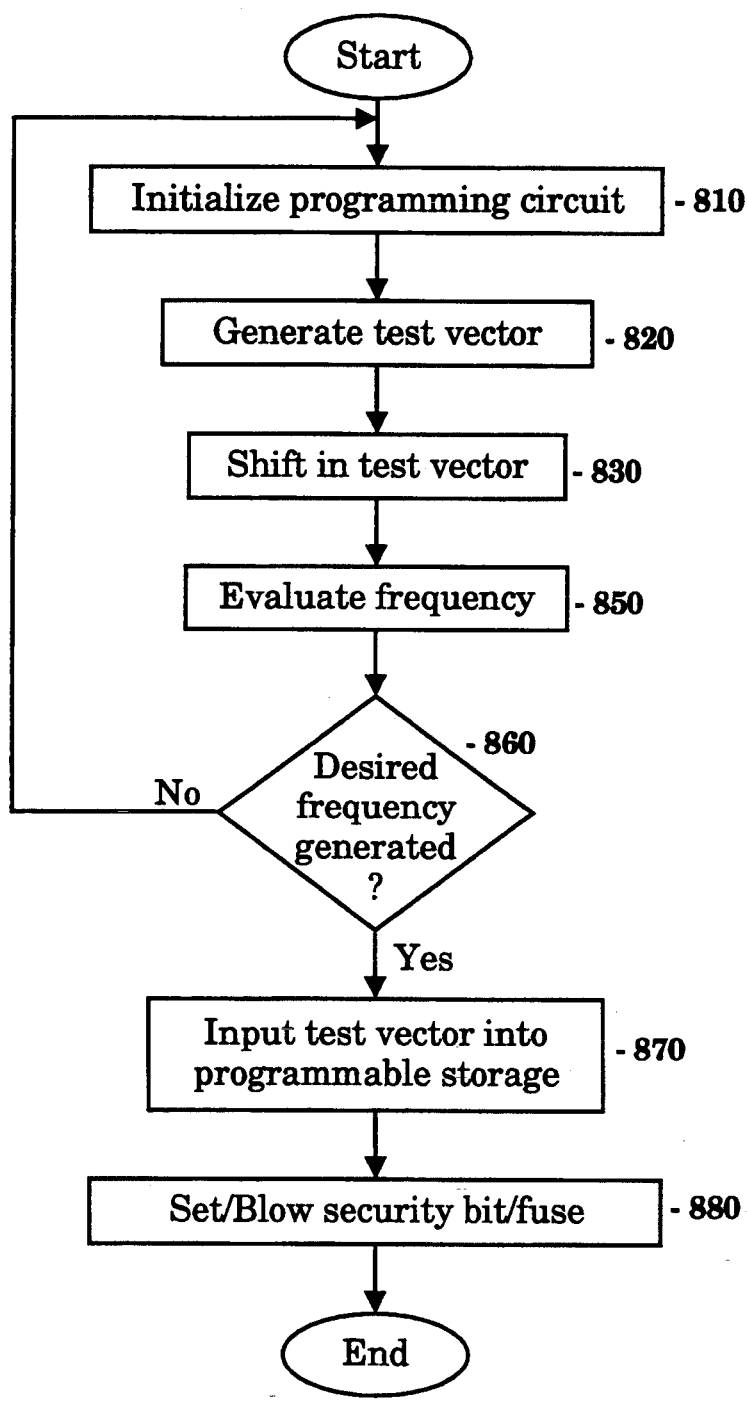
FIG. 8 is a flow diagram illustrating one embodiment for programming the crystal oscillator in accordance with the present invention.

FIG. 8 is a flow diagram illustrating one embodiment for programming the programmable crystal oscillator in accordance with the present invention. In order to program data into the crystal oscillator of the present invention, a circuit that generates a selectable input parameter is required. The programmable crystal oscillator of the present invention may operate in conjunction with any circuit that permits selection of the input parameter and generates the input parameter as serial data. As shown in step 810, the programmable crystal oscillator 100 is initialized, upon applying power to the device, to accept the input parameter. A test vector is generated for the desired frequency, and the test vector is input through the $\overline{OD}$ connection as shown in steps 820 and 830. The burn bit of the test vector is not set, and therefore the input parameter is not programmed in the programmable storage. However, the programmable crystal oscillator 100 is configured to generate an output frequency in accordance with the parameters of the test vector.

In step 850, the programmer may evaluate the output frequency of the crystal oscillator to determine whether the test vector generates the desired output frequency. If not, the programmer may generate a new test vector and repeat the process illustrated in steps 820, 830, and 850. If the programmable crystal oscillator 100 operates at the desired frequency, then the programmer may input the test vector, a single bit at a time, to blow or program the bit into the programmable storage 740. Between programming each bit of the test vector into the programmable storage 740, the power to the programmable crystal oscillator 100 is cycled. In addition, the security bit is set into the programmable storage 740 as shown in steps 870 and 880. The vector input to the programmable crystal oscillator 100 is thus programmed into the programmable storage 740, and retrieved in subsequent power-up operations to generate the output frequency.

FIG. 9 illustrates an input parameter for selecting a desired output frequency configured in accordance with one embodiment of the present invention. For the embodiment shown in FIG. 9, serial parameter data are input starting from the start bit. The use of the start, burn, and SECF bits were described above in conjunction with the description of the programming and control circuit 340. The "P" parameter bits, P0-P6, are utilized to program the "P" divider 520 in the phase lock loop 320 as described above. The CONFIG2 modifies the output structure to produce positive emitter coupled logic (ECL) compatible differential outputs. The CONFIG1 disables the crystal reference, and uses the output disable pin as a reference source. When using the output disable pin as a reference source, the output disable function is not available. The CONFIG0 changes the phase detector feedback source from the $F_{vco}$ signal output to an output pad. The setting of the CONFIG0 is useful in low skew reference-to-output applications.

The input parameter of the present invention also contains the Q parameter bits. The "Q" parameter bits, Q0-Q6, are utilized to program the "Q" divider 510 in the phase lock loop 320 as described above. The trim bit is used to coarse adjust the voltage controlled oscillator 560 for process variations that produce slow devices. The XMUX 2-0 bits are utilized as post divider selects to divide the $F_{vco}$ frequency for the output frequency. The three volt (3v) enable is used to adjust circuits for operation at 3.3 volts (e.g. default is 5.0 volts). The PH2-0 variables define phase adjustments. Specifically, the PH2-0 are used, when the CONFIG 0 bit is set, to null phase relationship between a reference input and output. The last two bits, DCA 10, define variations in duty cycle.

Although the present invention has been described in terms of specific exemplary embodiments, it will be appreciated that various modifications and alterations might be made by those skilled in the art without departing from the spirit and scope of the invention as set forth in the following claims.

What is claimed is:

1. A programmable crystal clock oscillator, said oscillator being programmable to provide a wide range of possible frequencies with high stability, said oscillator comprising:
   a package having a plurality of connections and no dedicated programming connections;
   a programmable storage within said package for storing a parameter representing a desired output frequency;
   a crystal within said package for providing a source frequency within said package; and
   a phase lock loop (PLL) circuit coupled to said crystal to receive said source frequency and coupled to said programmable storage, said PLL circuit being within said package and for producing said desired output frequency within said wide range of possible frequencies, said selected frequency being produced with high stability.

2. The programmable clock oscillator as set forth in claim 1, wherein said package comprises a four pin full size industry standard oscillator package comprising a size approximately 0.5 inches in width, 0.8 inches in length, and 0.25 inches in height.

3. The programmable crystal clock oscillator as set forth in claim 1, wherein said plurality of connections comprise four connections including an output disable pin, a supply voltage pin, a ground pin, and a frequency out pin for said desired output frequency.

4. The programmable crystal clock oscillator as set forth in claim 1, wherein said programmable storage comprises a plurality of electrically programmable fuses.

5. The programmable crystal clock oscillator as set forth in claim 1, wherein said programmable storage comprises an electrically programmable read only memory (EPROM).

6. The programmable crystal clock oscillator as set forth in claim 1, wherein said package comprises:
   an output disable connection for receiving said parameter representing said desired output frequency, and for disabling the output of said clock oscillator; and
   a shift register, coupled to said storage and said output disable connection, for receiving a parameter from an external source.

7. The programmable crystal clock oscillator as set forth in claim 6, wherein said parameter comprises a burn bit, and said storage further comprises storage control, coupled to said shift register, for programming said storage with said parameter input from said output disable connection when specified by said burn field.

8. The programmable crystal clock oscillator as set forth in claim 6, further comprising a multiplexer, coupled to said shift register and said storage, for selecting said parameter from either said shift register or said storage, wherein said parameter received from said shift register provides an output frequency for evaluation prior to storing said parameter in said storage.

9. The programmable crystal clock oscillator as set forth in claim 1, wherein said phase lock loop circuit comprises:
   a phase lock loop including p and q divider circuits for generating a voltage controlled oscillator frequency ($F_{vco}$), said p and q divider circuits being coupled to said storage to receive said parameter, for dividing said source frequency ($F_{xtal}$) in accordance with p and q variables specified by said parameter to generate said voltage controlled oscillator frequency ($F_{vco}$) in accordance with the relationship:

$$F_{vco} = \frac{F_{xtal} \cdot 2 \cdot P}{Q}$$

and
   a post divider circuit coupled to said phase lock loop and coupled to receive said parameter for dividing said voltage controlled oscillator frequency ($F_{vco}$) in accordance with said parameter to generate said selected frequency.

10. The programmable crystal clock oscillator as set forth in claim 1, wherein said package comprises a four pin half size industry standard oscillator package comprising a size approximately 0.5 inches in width, 0.5 inches in length, and 0.25 inches in height.

11. A method for providing a wide range of possible frequencies with high stability, said method comprising the steps of:
   providing a package having a plurality of connections and no dedicated programming connections;
   storing a parameter representing a desired output frequency within said package;
   providing a crystal within said package that specifies a source frequency;
   generating said desired output frequency based on said parameter stored and said source frequency of said crystal, said desired output frequency being within said wide range of possible frequencies and being produced with high stability.

12. The method as set forth in claim 11, wherein said package comprises a four pin full size industry standard oscillator package comprising a size approximately 0.5 inches in width, 0.8 inches in length, and 0.25 inches in height.

13. The method as set forth in claim 11, wherein said plurality of connections comprise four connections including an output disable pin, a supply voltage pin, a ground pin, and a frequency out pin for said desired output frequency.

14. The method as set forth in claim 11, wherein the step of storing a parameter comprises the step of storing said parameter in a plurality of electrically programmable fuses.

15. The method as set forth in claim 11, wherein the step of storing a parameter comprises the step of storing said parameter in an electrically programmable read only memory (EPROM).

16. The method as set forth in claim 11, further comprising the step of receiving said parameter from an external source representing said desired output frequency at an output disable connection on said package, said output disable connection being additionally used to disable the output of said clock oscillator.

17. The method as set forth in claim 16, further comprising the step of programming said parameter input from said output disable connection when specified by a burn field in said parameter so as to store said parameter within said package.

18. The method as set forth in claim 16, further comprising the step of selecting said parameter from either said output disable connection or from within said package, wherein said parameter input from said output disable connection provides an output frequency for evaluation prior to storing said parameter in said package.

19. The method as set forth in claim 16, wherein the step of generating said desired output frequency comprises the steps of:
   receiving p and q variables specified by said parameter; generating from said source frequency ($F_{xtal}$) a voltage controlled oscillator frequency ($F_{vco}$) in accordance with the relationship:

$$F_{vco} = \frac{F_{xtal} \cdot 2 \cdot P}{Q}$$

and
   dividing said voltage controlled oscillator frequency ($F_{vco}$) in accordance with said parameter to generate said selected frequency.

20. The method as set forth in claim 11, wherein said package comprises a four pin half size industry standard oscillator package comprising a size approximately 0.5 inches in width, 0.8 inches in length, and 0.25 inches in height.

* * * * *